United States Patent [19]

Steinberg

[11] 4,410,824
[45] Oct. 18, 1983

[54] MEANS FOR PREVENTING CRACKS IN THE GAP REGION OF A SURFACE ACOUSTIC WAVE DEVICE

[75] Inventor: Ronald F. Steinberg, Cockeysville, Md.

[73] Assignee: The Bendix Corporation, Southfield, Mich.

[21] Appl. No.: 404,785

[22] Filed: Aug. 3, 1982

[51] Int. Cl.³ .................. H03H 9/26; H01L 41/22
[52] U.S. Cl. ................. 310/313 R; 333/153; 364/821
[58] Field of Search ......... 310/313 R, 313 A–313 D; 333/150, 151, 153, 154; 364/821, 861

[56] References Cited

U.S. PATENT DOCUMENTS

| | | | |
|---|---|---|---|
| 3,840,825 | 10/1974 | Gerard | 333/150 |
| 4,063,202 | 12/1977 | Vasile | 333/72 |
| 4,181,904 | 1/1980 | Weller et al. | 333/153 |
| 4,314,393 | 2/1982 | Wakatsuki et al. | 29/25.35 |

*Primary Examiner*—J. D. Miller
*Assistant Examiner*—D. L. Rebsch
*Attorney, Agent, or Firm*—W. G. Christoforo; Bruce L. Lamb

[57] ABSTRACT

A thin film metallic loop is used to electrically short the gap between metallic portions of a surface acoustic wave device to eliminate substrate surface cracks. The loop is deposited on the substrate at the same time the structures defining the gap are deposited.

9 Claims, 3 Drawing Figures

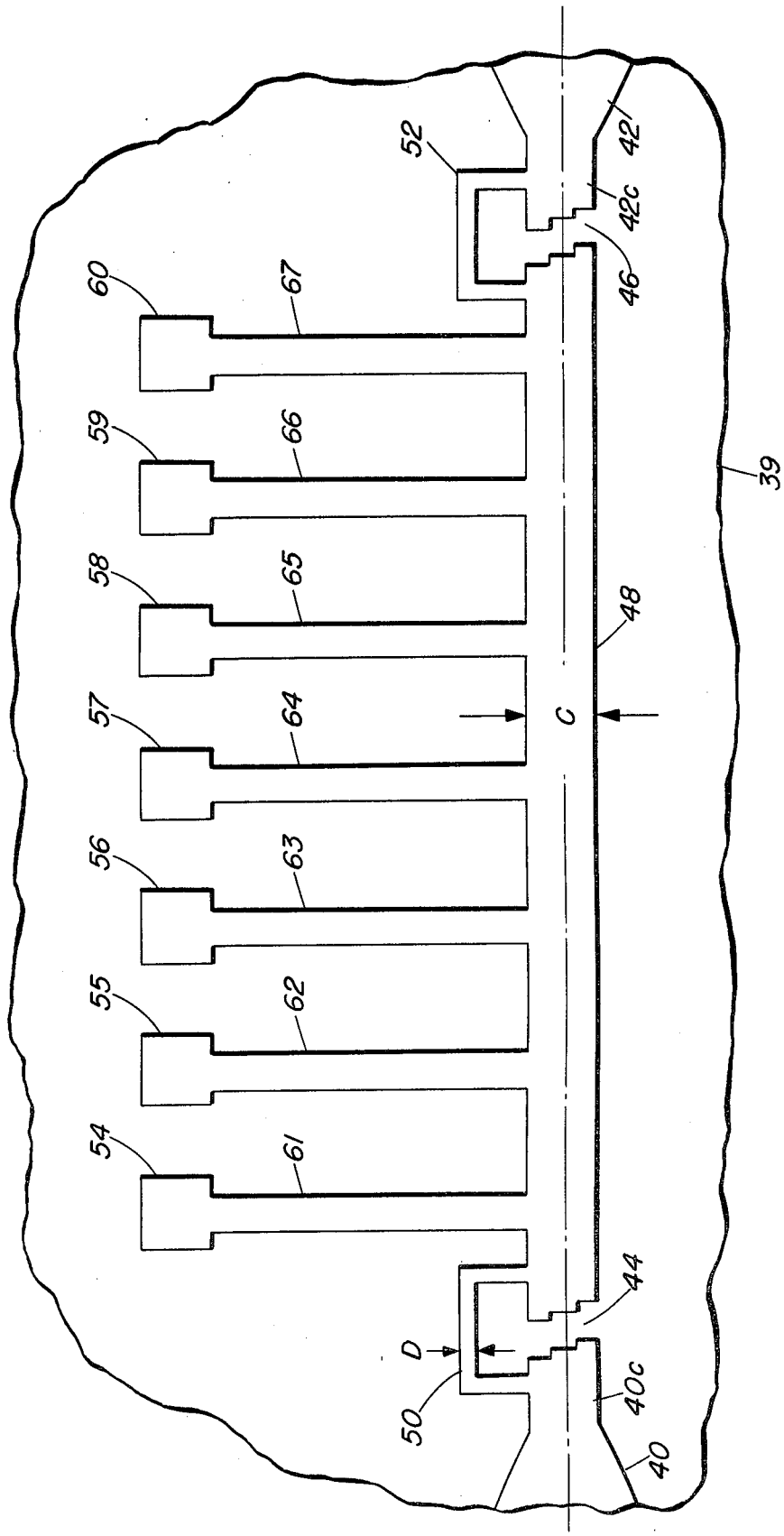

MEANS FOR PREVENTING CRACKS IN THE GAP REGION OF A SURFACE ACOUSTIC WAVE DEVICE

BACKGROUND OF THE INVENTION

This invention relates to surface acoustic wave (SAW) devices having a plurality of closely spaced metallic thin film structures disposed in close proximity to one another on a substrate surface.

A persistent problem encountered in the fabrication of SAW devices having a plurality of closely spaced metallic thin film structures disposed in close proximity to one another is the formation of surface cracks in the piezoelectric substrate, normally lithium niobate ($LiNbO_3$) or lithium tantalate ($LiTaO_3$) between such closely spaced metallic thin films. these cracks almost always develop during or shortly after the fabrication of the SAW device known as a SAW elastic convolver. The SAW elastic convolver, which directly utilizes the acoustic non-linearities of a piezoelectric substrate, comprises a set of opposing parabolically tapered horns to reduce the acoustic beamwidth of waves incident thereon and which are coupled thereto from acoustic wave generating transducers. The output from each horn, which is at the horn throat, is coupled to a narrow interaction channel where the actual signal convolution is accomplished. The beam compression provided by the horns increases the acoustic power density in the interactive channel so as to increase the convolver efficiency. The convolver elements described above are generally in the form of microstrip deposited on the piezoelectric substrate. The above mentioned coupling of the beam compressed waves from the tapered horn to the interactive channel is on the surface of the piezoelectric substrate across a narrow gap in the microstrip, between the horn throat and the interactive channel. The above mentioned cracks in the surface of the piezoelectric substrate almost always occur in these gaps at the final photolithographic lift-off process used to define a microstrip pattern on the substrate, although the cracks may not develop for several hours after the lift-off is completed. Further, the position of the cracks appears to be crystal orientation sensitive in that the cracks observed to data always occur at either the left or right hand edges of the gaps (there are at least two gaps on each substrate of a convolver) but never at both the left and right hand gap edges.

The presence of such cracks degrades the performance of SAW devices in that the cracks act as a reflection boundary to surface acoustic waves propagating along the surface of the piezoelectric substrate between the microstrip patterns. In SAW convolvers, in particular, such cracks in the gap between a tapered horn and the interaction channel cause a portion of the surface acoustic signals traveling thereover to be reflected back from the cracks. Such reflected signals interact (convolve) with the forward moving signals creating a self-convolution spurious signal which limits the device signal-to-noise ratio and the effective dynamic range.

The formation of such cracks is believed to be caused by electric fields developed across the gaps during fabrication of the SAW device. The source of such electric fields has been difficult to determine, however, it has been speculated that the electric fields are caused by static pickup, pyroelectric effects, trapped charges, stress or a combination of these.

SUMMARY OF THE INVENTION

The above mentioned surface cracks in the gap region of the substrate of a SAW device are effectively prevented from forming by providing an electrical shunt across the gap. More particularly, in a surface acoustic wave device having at least two thin film structures disposed on the surface of the substrate with a gap between the structures and the structures arranged so that a surface acoustic wave traversing a first structure is communicated to the second structure, cracks in the gap region of the substrate which are caused by fabrication of the device are prevented by a thin film loop which electrically shunts the gap. The shunt is arranged so that it extends, at its interface with thin film structures, generally perpendicular to the direction of travel of the surface acoustic wave. In addition, if the resistance of the shunt is significantly higher, e.g., at least about three times higher, than the output impedance of the device, the loop can be a permanent part of the SAW device and will have no significant effect on its operation.

The shunt is preferably deposited on the substrate with and at the same time as the other thin film structures.

In a more specific form of the invention the SAW device is a convolver and the thin film structures are two interdigital transducers, two parabolic horns, and an interaction channel, respectively.

The advantage of the invention is that it provides a means for eliminating cracks in the gap region between the horns and interaction channel of a SAW device.

A further advantage of the invention is that the means for preventing such cracks, namely a loop shorting the gap, can be a permanent part of the SAW device without effecting performance thereof.

BRIEF DESCRIPTION OF THE DRAWINGS

FIG. 2 shows an actual convolver using the means of the invention.

DESCRIPTION OF THE PREFERRED EMBODIMENT

Figure 1:
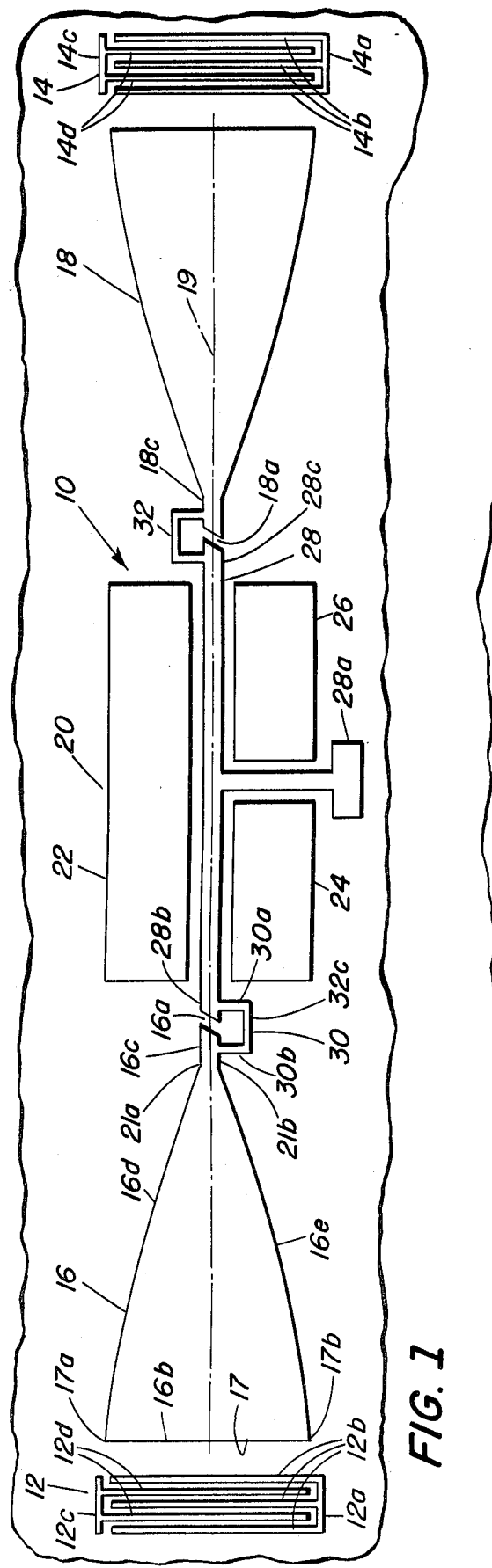
FIG. 1 is a simplified form of the means of the invention embodied as a SAW convolver.

The invention is illustrated in the SAW convolver 10 of FIG. 1, reference to which should be made. The convolver comprises input transducers 12 and 14, parabolic horns 16 and 18 and interaction channel structure 20 which in turn comprises of the ground planes 22, 24 and 26 and interaction channel 28. These elements, as known to those in the art, are microstrip disposed on a flat surface 30 of a piezoelectric material, typically lithium niobate. A typical horn, for example horn 16, includes an input end 16b, an output end 16c and side walls 16d and 16e which define a parabola. Typical horn input end 16b is generally defined by a straight line 17 perpendicular to the horn longitudinal axis 19, which axis is coextensive with the longitudinal axis of horn 18 and interaction 28. Horns 16 and 18 are disposed with respect to interaction channel 28 so as to form gaps 16a and 18a respectively in the microstrip comprising horns 16 and 18 and interaction channel 28.

The function of convolver 10 is to convolve one signal, applied at transducer 12, with a second signal, applied at transducer 14, to produce the convolved resultant at port 28a, which is a branch extending at a right angle from the midpoint of interaction channel 28.

The operation of convolver 10 is as follows. One signal, suitably an electrical signal, is applied (by means not shown) to transducer 12 across interleaved sections 12a and 12c, respectively comprising conductive tracks 12b interleaved with conductive tracks 12d. In response to the applied electrical signal transducer 12 generates an acoustic wave on the piezoelectric surface, whose wave front is parallel to tracks 12b and 12d. The wave is received at input end 16b of parabolic horn 16. The wave incident on horn input end 16b tends to be contained within the horn structure and the wave front traverses therethrough generally perpendicular to longitudinal axis 19 toward horn output end 16c. In traversing the horn, the portion of the wave front incident on parabolic sides 16d and 16e will be reflected therefrom into output end 16c. This action of the horn will compress the wave or beam traversing therethrough by a factor equal to the ratio of the width of input end 16b, that is, the distance between points 17a and 17b, to the width of output end 16c, that is, the distance between points 21a and 21b. In a typical horn the beam compression will be about 10:1.

Simultaneously, a second signal, to be convolved with the first signal, is applied to transducer 14 across interleaved sections 14a and 14c comprising conductive tracks 14b interleaved with conductive tracks 14d. The resulting acoustic wave traverses horn 18 in the manner just described with respect to horn 16, and the beam compressed wave exits horn 18 at output end 18c. The beam compressed wave at horn output end 16c is coupled across the piezoelectric surface to port 28b of interaction channel 28 and the beam compressed wave at horn output end 18c is coupled across the piezoelectric surface to port 28c of interaction channel. The bias cut gap shown between a horn output end and an interaction channel, for example bias cut gap 16a, provides less coherent reflection of the signal coupled between the horn output end and the interaction channel as known to those in the art. The acoustic waves in interaction channel 28 will interact or convolve with one another to produce the convolved resultant at port 28a.

Microstrip loops 30 and 32 electrically shorting, respectively, gaps 16a and 18a have no operational function but are provided to prevent surface cracks from forming in the gap region during fabrication of the SAW device. Preferably, the patterns for loops 30 and 32 are built in the photolithographic mask used to define the microstrip pattern on the piezoelectric crystal surface during fabrication. It is to be noted that a typical loop, such as loop 30, comprises legs 30a and 30b which extend away from horn 16 and interaction channel 28 perpendicularly to longitudinal axis 19. The legs are bridged by a microstrip section 30c which extends parallel to the longitudinal axis 19. In a broader sense, the loop can be any form such as arcuate, it being preferred that it extend perpendicular from the horn and interaction channel at the loop interface therewith. If the resistance of a typical loop is significantly greater than the output impedance of the SAW device, the presence of the loop will have no significant effect on the operation of the device and the loop can be a permanent part thereof. This is a particularly attractive feature since it is generally difficult to remove microstrip material after fabrication without damaging the SAW device. The output impedance of a typical SAW convolver is about 50 ohms. A loop resistance of about 150 to 500 ohms will not only protect against substrate surface cracking in the gap region, but also such a loop can be left in place as a permanent part of the convolver without effecting convolver performance.

FIG. 2 shows, in part, an actual convolver built using the invention on a substrate 39. Throats 40c and 42c of tapered horns 40 and 42 are shown communicating across gaps 44 and 46, respectively with interaction channel 48. It should be understood that although horns 40 and 42 are shown truncated they are actually similar to the tapered parabolic horns of FIG. 1 and that transducers similar to those of FIG. 1 are used at the inputs to the horns in the manner described above with respect to FIG. 1. Returning to FIG. 2, it is seen that the bias cut of gaps 44 and 46 here is stepped, in three distinct steps, rather than the smooth bias gap of FIG. 1, again to reduce coherent reflections from the ends of the horns and interaction region.

Interaction channel 48, in this embodiment, has a plurality of equally spaced output ports 54 to 60 which are disposed respectively on branches 61 to 68 extending at a right angle from the side of interaction channel 48. As known to those skilled in the art, use of such plurality of output ports, at which results of the convolution being performed in interaction channel 48 appear during the convolution, allows a more uniform convolution output signal as a function of distance along the interaction channel.

Microstrip loops 50 and 52 are provided as electrical shunts across gaps 44 and 46, respectively. These loops, of course, are deposited on the substrate simultaneously with the rest of the microstrip components comprising the convolver, as explained above, and prevent substrate cracks in the gap area. In this embodiment, the width of interaction channel 48, that is dimension C, is about 32 um, while the width of a typical loop, for example, diameter D, is about 10 um. These dimensions provide a convolver output impedance of about 50 ohms and a loop resistance of about 150 ohms, a relationship that causes no significant effect on convolver performance if the loop is left intact in a permanent part of the convolver.

Figure 3:
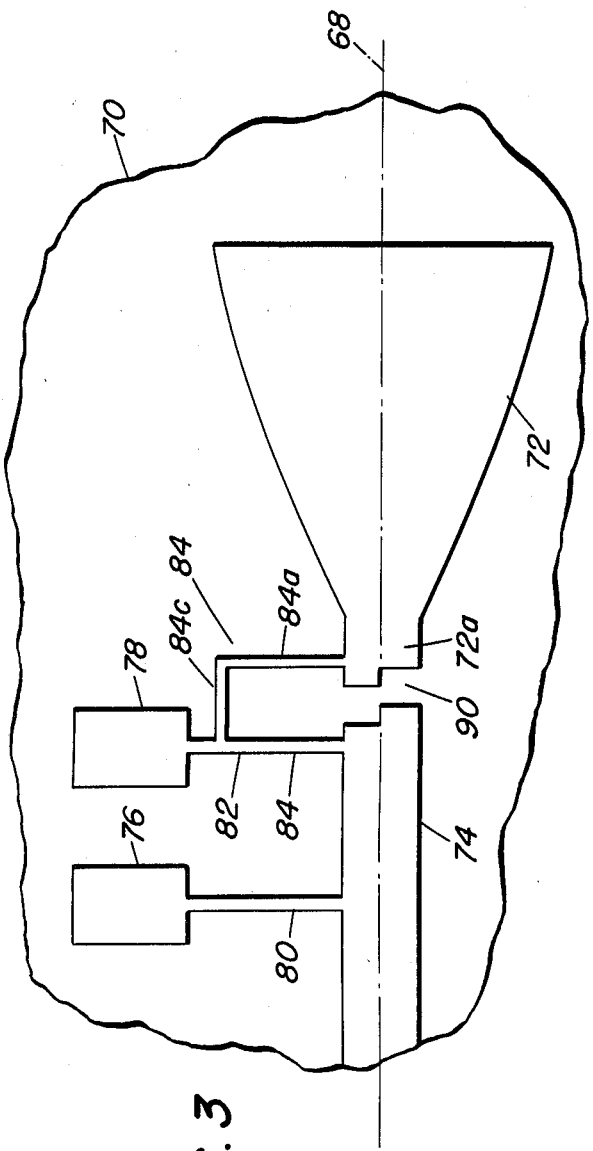
FIG. 3 shows a slightly different form of the means of the invention.

Refer now to FIG. 3 which shows a portion of a convolver structure disposed on substrate 70. The convolver structure shown comprises thin film parabolic horn 72 having throat 72a, and thin film interaction channel 74, having output ports 76 and 78 disposed on arms 80 and 82, respectively. As before, stepped gap 90 is provided between horn 72 and interaction channel 74 across which surface acoustic waves traversing horn 72 along longitudinal axis 68 are coupled to interaction channel 74. Also as before, a thin film loop 84 electrically shunts gap 90. Loop 84 consists of legs 84a and 84b at right angles to longitudinal axis 68 and a thin film section 84c connecting the ends thereof. In this embodiment leg 84b is also branch or arm 82 for port 78. This scheme of using a port branch for a portion of the loop can be used when the port is located close to the gap.

The invention claimed is:

1. In a surface acoustic wave device having at least two thin film structures disposed on the surface of a substrate, there being a gap between said structures, said structures being arranged so that a surface acoustic wave traversing a first of said structures is communicated across said gap to the second of said structures, and a thin film loop electrically shunting said gap to prevent cracks in the gap region of said substrate from being induced during fabrication of said surface acoustic wave device.

2. The means for preventing cracks of claim 1 wherein said thin film structures are disposed along a longitudinal axis of said surface acoustic wave device, a surface acoustic wave generally traversing along said longitudinal axis, said loop including a pair of electrically conductive legs, each leg of said pair being disposed opposite the other leg of said pair on opposite sides of said gap and generally perpendicular to said longitudinal axis and means electrically bridging the ends of said legs remote from said gap.

3. The means for preventing cracks of claim 1 wherein said loop is an electrically conductive microstrip interconnecting said thin film structures across said gap.

4. The means for preventing cracks of claim 1 wherein the resistance of said loop is significantly greater than the output impedance of said surface acoustic wave device.

5. The means for preventing cracks of claim 1 wherein the output impedance of said acoustic wave device is at most about one-third the resistance of said loop.

6. In a surface acoustic wave convolver having at least one thin film parabolic horn and an interaction channel disposed on a substrate, said horn having a relatively wide input end for receiving a surface acoustic wave incident thereon and a relatively narrow output end which communicates with said interaction channel across a gap and along the surface of said substrate, and a thin film loop electrically shunting said gap to prevent cracks in the gap region of said substrate.

7. The means for preventing cracks of claim 6 wherein said thin film loop extends generally perpendicular to the direction of travel of said surface acoustic wave in said convolver at the interface of the loop with said horn and said interaction channel.

8. The means for preventing cracks of claim 6 wherein the resistance of said loop is significantly greater than the output impedance of said surface acoustic wave convolver.

9. The means for preventing cracks of claim 6 wherein the output impedance of said surface acoustic wave convolver is at most about one-third the resistance of said loop.

* * * * *